United States Patent
Denman

(10) Patent No.: US 6,261,680 B1
(45) Date of Patent: Jul. 17, 2001

(54) ELECTRONIC ASSEMBLY WITH CHARGE-DISSIPATING TRANSPARENT CONFORMAL COATING

(75) Inventor: James R. Denman, El Segundo, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/457,099

(22) Filed: Dec. 7, 1999

(51) Int. Cl.[7] ........................................... B32B 5/16
(52) U.S. Cl. .................... 428/328; 428/330; 428/423.1
(58) Field of Search .................... 428/328, 329, 428/330, 423.1; 524/401, 430, 432, 433, 910, 912, 911; 252/500, 518.1

(56) References Cited

U.S. PATENT DOCUMENTS

| | | | |
|---|---|---|---|
| 5,276,080 | * 1/1994 | Oku | 524/432 |
| 5,366,664 | * 11/1994 | Varadan et al. | 252/512 |
| 5,618,872 | * 4/1997 | Pohl et al. | 524/430 |
| 5,639,989 | * 6/1997 | Higgins, III | 174/35 |

* cited by examiner

*Primary Examiner*—D. S. Nakarani
*Assistant Examiner*—Christopher Paulraj
(74) *Attorney, Agent, or Firm*—T. Gudmestad

(57) ABSTRACT

A coated electronic assembly comprises an electronic assembly, and a single-layer conformal coating overlying at least a portion of the electronic assembly. The conformal coating has a volume electrical resistivity of from about $10^8$ to about $10^{14}$ ohm-centimeter. The conformal coating is formed of an organic polymeric binder, and a plurality of electrically semiconductive metal oxide filler particles dispersed in the binder. The binder and the filler particles have substantially the same visible-light refractive index. The binder may be a heat-curable or UV-curable urethane, and the particles may be doped $(Al,Mg,Zn)_3O_4$ or doped ZnO.

20 Claims, 2 Drawing Sheets

ELECTRONIC ASSEMBLY WITH CHARGE-DISSIPATING TRANSPARENT CONFORMAL COATING

BACKGROUND OF THE INVENTION

This invention relates to electronic assemblies, and, more particularly, to the dissipation of accumulated charges and the protection of such electronic assemblies.

In one common architecture, electronic devices are assembled onto substrates, forming electronic subsystems. The subsystems are assembled into a chassis or other housing which, with appropriate interconnections and external connections, forms the electronic system. A well-known version of this architecture is the printed wiring board (PWB) or printed circuit board (PCB) widely used in consumer electronics.

PWBs are sometimes used in applications which may be subjected to adverse environments, such as in military or space applications. It is known to protect the PWB, including the circuitry and electronic components thereon, with a conformal coating. This conformal coating seals and protects the PWB circuit against adverse external influences such as foreign objects, moisture, corrosion, and solvents. The conformal coating aids in the mechanical support of the electronic components and helps protect the PWB circuitry against thermal shock.

The conformal coating also electrically insulates the PWB. In many applications, such electrical insulation of the PWB is desirable in that it reduces the risk of electrical shorting by foreign objects which may contact the PWB. In others, it may be undesirable because it results in charge accumulation which, in turn, can cause arcing or other electrical damage to the components on the PWB. In space applications, for example, the PWB is subjected to a flux of electrons during service. The electrons remain generally stationary on the PWB, resulting in charge accumulation. The PWB is therefore typically electrically grounded in such applications, although the grounding may not be fully effective because there still may be harmful charge accumulations in some regions of the PWB.

Two types of conformal coatings are in widespread use today. One is the standard MIL-I-46058 insulating coating, which provides for no dissipation of the accumulated charge. The other is a two-layer coating in which one layer is sufficiently electrically conductive to dissipate accumulated static charge. The two-layer coating, while operable to some degree, suffers from the shortcomings that it must be applied very carefully to avoid inhomogeneities that interrupt the charge dissipation, and it may also act as a capacitor to interfere with the operation of the electronic components.

There is a need for an improved conformal coating for electronic devices and substrates. The present invention fulfills this need, and further provides related advantages.

SUMMARY OF THE INVENTION

This invention provides a single-layer conformal coating for use on electronic assemblies such as printed wiring boards. The single-layer conformal coating protects the electronic assemblies from damage by foreign objects, moisture, corrosion, and solvents, aids in the mechanical support of the electronic components, and helps protect the PWB circuitry against thermal shock. The single-layer conformal coating has sufficient electrical conductivity to dissipate electrical charges. The single-layer conformal coating of the invention has also been found to protect the coated electronic assembly from radiation damage, while existing coatings provide little such protection. The conformal coating may be applied by straightforward techniques such as spraying, wiping, dipping, or painting. Because there is only a single layer, there is no concern with the relative thickness inhomogeneities that may affect the performance of two-layer coatings. Another important advantage is that the conformal coating is sufficiently transparent that the underlying circuitry and components of the electronic assembly may be visually inspected through the conformal coating, due to the low hiding power of the conformal coating. By comparison, the coating according to MIL-I-46058 is transparent, but the conventional two-layer coating is opaque.

In accordance with the invention, a coated electronic assembly comprises an electronic assembly, and a single-layer conformal coating overlying at least a portion of the electronic assembly. The electronic assembly may be of any type, such as, for example a PWB, a chip-on-board structure, or a ceramic-substrate device. The coating has a volume resistivity of from about $10^8$ to about $10^{14}$ ohm-centimeter, more preferably from about $10^{10}$ to about $10^{12}$ ohm-centimeter, and comprises an organic polymeric binder and a plurality of electrically semiconductive filler particles dispersed in the binder. The filler particles are preferably metal oxide particles. The single-layer conformal coating has substantially the same mixture composition of binder and particles throughout its volume. In one embodiment, the binder and the filler particles have similar visible-light refractive indices, so that the conformal coating is sufficiently transparent to permit inspection of the underlying electronic assembly.

In a preferred version of the conformal coating, the organic polymeric binder is a cured urethane (polyurethane). Such urethanes may be selected for curing by heat or by ultraviolet light. The filler particles, which desirably have a band gap of about 50 meV, are preferably $(Al,Mg,Zn)_3O_4$ or ZnO, doped with a cationic or anionic dopant. The filler particles and binder are preferably, but not necessarily, present in a weight ratio of from about 1:1 to about 5:1. For the case where the UV-curable polymeric binder is used, the particles are selected to be transparent to UV energy of the curing wavelength.

By selecting the binder and the particles so that their indices of refraction to visible light are about the same, the conformal coating may be made sufficiently transparent so that the underlying structure may be inspected through the conformal coating. In the preferred case, the index of refraction of the binder is from about 1.48 to about 1.50, and the index of refraction of the particles is from about 1.8 to about 2.0. This coating is translucent and light yellow to tan in color, but is still sufficiently transparent to allow inspection of the underlying structure. To achieve sufficient transparency, the indices of refraction for the particles and the binder would be selected such that they are different by no more than about 0.5. To achieve full transparency, the indices of refraction for the particles and the binder would be selected such that they are different by no more than about 0.05.

The conformal coating may be applied by any convenient technique such as painting, spraying, wiping or dipping. The conformal coating, after application and curing, typically has a thickness of from about 0.002 inch to about 0.020 inch. A carrier fluid such as a ketone, an acetate, or a naphtha may be provided in the uncured conformal coating to modify its viscosity and thus aid in its application. The conformal coating may be applied in one or several coats. The application of multiple coats of the single-layer conformal coating composition is distinct from prior conformal coatings in which two different layers of different compositions are applied.

The conformal coating of the invention protects the electronic assembly against damage by foreign objects, moisture, corrosion, and solvents. It also shields the electronic assembly against radiation damage. The conformal coating dissipates electrical charge, protecting the electronic assembly against arcing. However, the electrical resistance of the conformal coating remains sufficiently high that it protects against shorting and other electrical damage. The conformal coating is sufficiently transparent to permit inspection of the underlying circuitry after curing of the coating. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
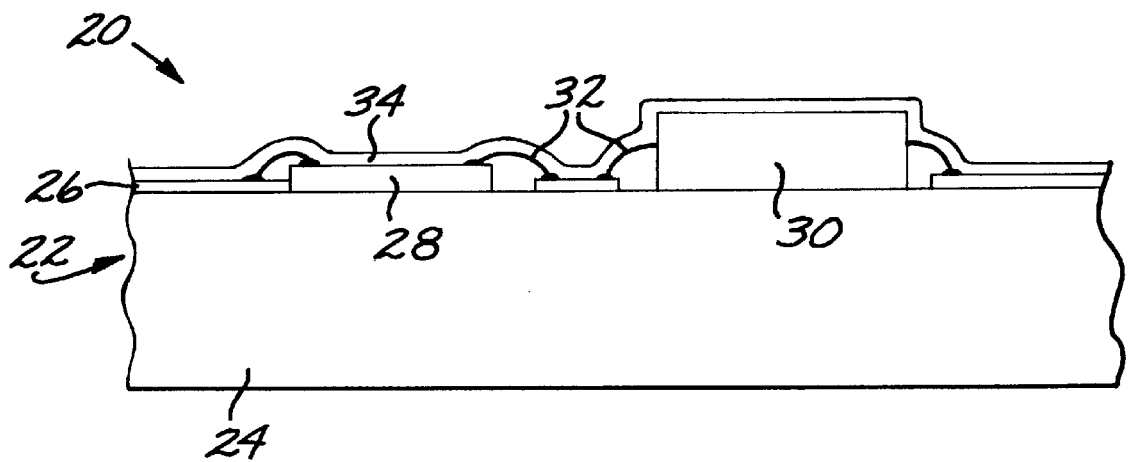
FIG. 1 is a schematic sectional view of a printed wiring board with an overlying conformal coating.

FIG. 1 depicts a coated electronic assembly 20. It includes an electronic assembly 22 of any operable type. In the illustrated preferred case, the electronic assembly 22 is a printed wiring board (PWB) architecture, including an electrically nonconductive substrate 24, an electrically conductive trace 26 deposited on the substrate, and components such as an integrated circuit 28 and a discrete component 30 (e.g., a capacitor) affixed to the substrate. The trace 26 and the components 28 and 30 are interconnected by fine wires 32 or other suitable connectors or connections. The PWB architecture is presently preferred and is illustrated, but the conformal coating is suitable for use with other existing electronic assemblies such as chip-on-board architectures and ceramic-substrate devices, and with future types of electronic assemblies.

A conformal coating 34 covers and encapsulates the components 28 and 30, the trace 26, the connectors 32, and any exposed surfaces of the substrate 28. It con-forms to the shape of the elements it covers. The conformal coating 34 thus seals and mechanically protects these coated elements.

Figure 2:
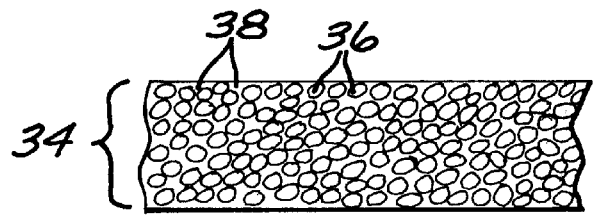
FIG. 2 is a detail enlargement of the conformal coating.

FIG. 2 illustrates the physical structure of the conformal coating 34 in greater detail. The conformal coating 34 comprises a plurality of electrically semiconductive filler particles 36, preferably metal-oxide filler particles, dispersed in an organic polymeric binder 38 which serves as the matrix of the composite conformal coating. The dispersion of particles 36 in the binder 38 is generally uniform, although it need not be perfectly uniform.

Figure 3:
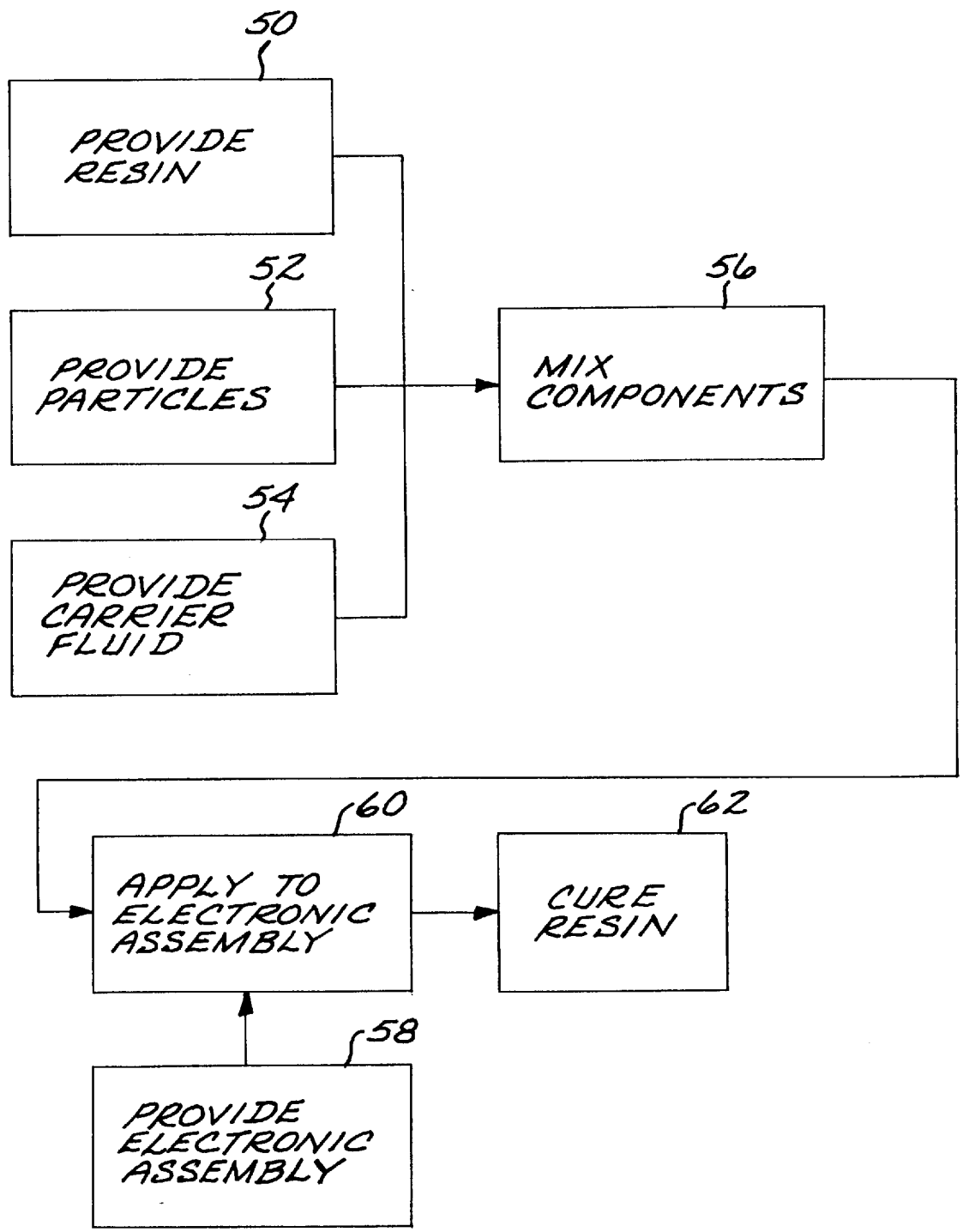
FIG. 3 is a block flow diagram of a method for preparing the coated electronic assembly.

FIG. 3 is a block flow diagram of a method for preparing the coated electronic assembly 20. A resin used to form the binder 38 is provided, numeral 50. The resin is preferably a curable thermosetting organic composition. Most preferably, the resin is a heat-curable or ultraviolet (UV)-curable urethane available in a liquid form having a viscosity comparable to that of a syrup. Upon curing, the resulting polyurethane is tough and flexible, and serves as a barrier against intrusion of corrosives and other chemicals to the electronic assembly 22. Upon curing, the polyurethane is also transparent, with a refractive index for visible light of from about 1.48 to about 1.50. A wide variety of urethanes are available commercially, with appropriate additions to allow heat curing and/or UV curing. A preferred commercial heat-cured urethane is Uralane 5750, available from Furane. Preferred commercial UV-cured urethanes are Uvicoat 7503 or Uvicoat 7504, available from Aptek Laboratories, Inc. These UV-cured urethanes cure with UV radiation of about 300–375 nanometers wavelength. Other resins such as silicones are also operable.

Particles are provided, numeral 52. The particles are preferably metal oxides which are doped to be electrically semiconductive. The particles are selected with several additional criteria in mind. Where the resin of the binder is to be cured by ultraviolet radiation of the curing wavelength, the particles must be transparent to that curing wavelength. In the preferred case discussed above using the UV curable resin, the particles must be transparent to radiation in the range of from about 300 to about 375 nanometers. The particles may be of any operable size, as long as their diameter is less than, preferably significantly less than, the thickness of the final conformal coating.

The metal oxide particles and the binder are preferably cooperatively selected so that the cured binder and the filler particles have visible-light indices of refraction that are sufficiently close to each other that the final coating is sufficiently transparent to permit inspection of the underlying electronic assembly. In the preferred case, the binder has an index of refraction of about 1.48–1.50, and the particles have an index of refraction of about 1.8–2.0, which yields a conformal coating that is translucent but sufficiently transparent to inspect the underlying structure. By selecting a binder and particles with even more closely matched indices of refraction, an even more transparent conformal coating may be produced. To achieve sufficient transparency to view underlying structure, the indices of refraction for the particles and the binder would be selected such that they are different by no more than about 0.5. To achieve full transparency, the indices of refraction for the particles and the binder would be selected such that they are different by no more than about 0.05.

Two preferred particle compositions are $(Al,Mg,Zn)_3O_4$ or ZnO doped with a cationic or an ionic dopant. The $(Al,Mg,Zn)_3O_4$ formulation, expressed as $(Al_{1.98}Mg_{0.50}In_{0.02}Ti_{0.02}Zn_{0.48}O_4)$ is prepared from a nominal composition in parts by weight (pbw) of 23.74 pbw ZnO, 61.35 pbw $Al_2O_3$, 12.25 pbw MgO, 1.69 pbw $In_2O_3$, and 0.97 pbw $TiO_2$. The indium and the titanium are the dopants. The ZnO formulation is prepared from a nominal composition in parts by weight of 98.59 pbw ZnO, 0.43 pbw $B_2O_3$, 0.81 pbw $Ga_2O_3$, and 0.17 pbw $In_2O_3$. The boron, gallium, and indium are the dopants. The $(Al,Mg,Zn)_3O_4$-based particles have a C1 spinel (cubic) crystal structure, and the ZnO-based particles have a wurtzite crystal structure. Both types of particles have visible-light indices of refraction of from about 1.8 to about 2.0. They therefore have visible-light indices of refraction within about 0.5 of that of the binder, and result in a final conformal coating with sufficient transparency to inspect some features of the underlying structure.

Other operable types of particles having limited electrical conductivity may be used as well.

A carrier fluid may optionally be provided, numeral 54. The carrier fluid typically acts as a solvent to dissolve the resin, and also carries the particles as a temporary suspension. The carrier fluid is used to facilitate the subsequent mixing of the resin and the particles, and also to adjust the consistency of the mixture to be suitable for the selected application procedure. A suitable solvent for the preferred urethane is a ketone, an acetate, or a naphtha, which solvent is also suitable as the carrier fluid.

The resin, particle, and optional carrier fluid components are mixed together, numeral 56, to form a uniform mixture. Mixing is accomplished by hand or, more preferably, with a ball mill. The weight ratio of particles to resin in the mixture is preferably from about 1:1 to about 5:1, although ratios outside this range are operable. If the ratio is less than about 1:1, the conformal coating is operable but the electrical conductivity of the conformal coating is too low to be static dissipative. If the ratio is more than about 5:1, the critical solids volume concentration is exceeded, and the conformal coating tends to be weak but still operable when cured. The carrier fluid is added in a sufficient amount to dissolve the binder resin, to aid in the mixing, and to achieve the desired viscosity according to the application procedure to be used.

The final conformal coating has a volume resistivity of from about $10^8$ to about $10^{14}$ ohm-centimeter, more preferably from about $10^{10}$ to about $10^{12}$ ohm-centimeter. If the volume resistivity is too low, the conformal coating is operable for physical coating protection but has too high an electrical conductivity and does not provide protection against shorting. If the volume resistivity is too high, the conformal coating is operable for physical coating protection but has too low an electrical conductivity to dissipate static charge in a satisfactory manner. Optimal performance is produced in the more-preferred volume resistivity range of from about $10^{10}$ to about $10^{12}$ ohm-centimeter.

Optionally, other constituents may be added to the mixture, such as coupling agents, wetting agents, and the like. The conformal coating is operable without such additions, and it is preferred that they not be used.

At this point, the uncured conformal coating composition is ready for application. It has a flowable consistency whose viscosity is dependent upon the amount of carrier fluid used.

The electronic assembly 22 to be conformally coated is provided, numeral 58. The electronic assembly is of any operable type, preferably a printed wiring board. The electronic assembly is prepared according to procedures well known in the art for the particular type of electronic assembly.

The electronic assembly 22 is coated with the fluid conformal coating, step 60. The coating may be accomplished by any operable technique, such as painting, spraying, wiping, or dipping. The viscosity of the fluid conformal coating prior to curing is selected to be compatible with the application technique. After curing, the conformal coating 34 preferably has a thickness of from about 0.002 inch to about 0.020 inch, most preferably about 0.010 inch. The conformal coating 34 may be applied as a single coat, or as multiple coats with drying between coats. Each of the coats has substantially the same composition. The result of single or multiple coating applications is a substantially homogeneous single-layer final coating having substantially the same mixture of binder and particles throughout its volume. This approach is distinct from a prior art approach where two or more layers of significantly different compositions and functions are applied. In this prior approach, inhomogeneities in the compositions and thicknesses of the layers lead to inconsistent performance of the final coating, which problem is avoided with the present single-layer coating.

The resin is cured by a suitable method, numeral 62, as recommended for the binder material. For the heat-cured Uralane 5750 urethane resin, the curing is accomplished by heating to 82° C. for 2 hours. For the UV-cured Uvicoat 7503 or Uvicoat 7504 urethane resins, the curing radiation is 300–375 nanometers wavelength and is applied for 160 seconds at 64 joules. The use of the UV-cured resin is preferred for applications involving sensitive microelectronic devices, because it is not necessary to heat the electronic assembly 22.

The invention has been reduced to practice using both $(Al,Mg,Zn)_3O_4$-based and ZnO-based particles, and both the Uralane 5750 and Uvikote 7503 urethane resins, and the preferred techniques discussed above with a 3:1 weight ratio of particles to binder. The mixtures were milled for 14–25 hours to a Hegman grind of 7 to 7+. Substrates which were coated included 0.002 inch thick polyimide polymer sheet, copper/epoxy glass PWB, copper/polyimide glass PWB, and viewgraph film with printing thereon ranging from 6 to 20 point type and varying fonts. Coating techniques included draw down, pour and brush, and template wipe.

The flexibility of the coating was determined by bending the coated polymer sheet around a mandrel back on itself. The coating remained uncracked with mandrel diameters as small as ⅛ inch. The surface resistivity of the $(Al,Mg,Zn)_3O_4$-based coating on the polyimide polymer sheets was about $10^{12}$ ohms per square, and the surface resistivity of the ZnO-based coating was about $10^{11}$ ohms per square. The volume insulation resistance of both types of coatings was about $10^{11}$ ohm-cm. Both types of coatings withstood without cracking a thermal shock test of being plunged into liquid nitrogen from room temperature, and then returned to room temperature. The coatings protected against moisture and other types of exposure, and did not change resistance after moisture exposure.

The coatings were sufficiently transparent to read the 6 point type when coated onto the viewgraph substrate. The urethane was clear as received, and the cured conformal coating 34 was light yellow to tan in color.

An unexpected benefit of the present conformal coating is that it provides a significant degree of radiation shielding for the components on the electronic assembly. A study indicates that the conformal coating of the invention in 0.006 inch thickness provides about the same shielding against particulate radiation as the same thickness of aluminum. This allows the elimination of some radiation shields now required to protect the electronic assembly.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A coated electronic assembly, comprising:
   an electronic assembly comprising a substrate and at least one electronic component mounted on the substrate; and
   a single-layer conformal coating overlying at least a portion of the substrate and the at least one electronic component mounted on the substrate, the conformal coating having a volume resistivity of from about $10^8$ to about $10^{14}$ ohm-centimeter and comprising an organic polymeric binder and a plurality of electrically semiconductive filler particles dispersed in the binder.

2. The coated electronic assembly of claim 1, wherein the weight ratio of filler particles to binder is from about 1:1 to about 5:1.

3. The coated electronic assembly of claim 1, wherein the filler particles are metal oxide filler particles doped so as to be electrically semiconductive.

4. The coated electronic assembly of claim 1, wherein the filler particles comprise a composition $(Al,Mg,Zn)_3O_4$ doped with a dopant selected from the group consisting of a cationic dopant and an anionic dopant.

5. The coated electronic assembly of claim 1, wherein the filler particles comprise a composition ZnO doped with a dopant selected from the group consisting of a cationic dopant and an anionic dopant.

6. The coated electronic assembly of claim 1, wherein the polymeric binder is a urethane.

7. The coated electronic assembly of claim 1, wherein the polymeric binder is curable by ultraviolet energy of a curing wavelength.

8. The coated electronic assembly of claim 7, wherein the filler particles are transparent to the ultraviolet energy of the curing wavelength.

9. The coated electronic assembly of claim 1, wherein the polymeric binder is curable by heat.

10. The coated electronic assembly of claim 1, wherein the binder and the filler particles have visible-light refractive indices that are different by no more than about 0.5.

11. The coated electronic assembly of claim 1, wherein the binder and the filler particles have visible-light refractive indices that are different by no more than about 0.05.

12. A coated electronic assembly, comprising:

an electronic assembly comprising a substrate and at least one electronic component mounted on the substrate; and a single-layer conformal coating overlying at least a portion of the substrate and the at least one electronic component mounted on the substrate, the conformal coating having a volume resistivity of from about $10^8$ to about $10^{14}$ ohm-centimeter and having a weight ratio of the filler particles to the binder being from about 1:1 to about 5:1, the conformal coating comprising:

an organic polymeric binder and a plurality of doped metal oxide filler particles dispersed in the binder, wherein the binder and the filler particles have visible-light refractive indices that are different by no more than about 0.5.

13. The coated electronic assembly of claim 12, wherein the filler particles comprise a composition $(Al,Mg,Zn)_3O_4$ doped with a dopant selected from the group consisting of a cationic dopant and an anionic dopant.

14. The coated electronic assembly of claim 12, wherein the filler particles comprise a composition ZnO doped with a dopant selected from the group consisting of a cationic dopant and an anionic dopant.

15. The coated electronic assembly of claim 12, wherein the polymeric binder is a urethane.

16. The coated electronic assembly of claim 12, wherein the polymeric binder is curable by ultraviolet energy of a curing wavelength.

17. The coated electronic assembly of claim 16, wherein the filler particles are transparent to the ultraviolet energy of the curing wavelength.

18. The coated electronic assembly of claim 12, wherein the polymeric binder is curable by heat.

19. The coated electronic assembly of claim 12, wherein the binder and the filler particles have visible-light refractive indices that are different by no more than about 0.05.

20. A coated electronic assembly, comprising:

an electronic assembly comprising a substrate and at least one electronic component mounted on the substrate; and a single-layer conformal coating overlying at least a portion of the substrate and the at least one electronic component mounted on the substrate, the conformal coating having a volume resistivity of from about $10^8$ to about $10^{14}$ ohm-centimeter and having a weight ratio of the filler particles to the binder being from about 1:1 to about 5:1, the conformal coating comprising:

a urethane polymeric binder which is curable by ultraviolet energy and a plurality of doped metal oxide filler particles dispersed in the binder, wherein the binder and the filler particles have visible-light refractive indices that are different by no more than about 0.5.

\* \* \* \* \*